United States Patent [19]
Wong et al.

[11] Patent Number: 5,442,304
[45] Date of Patent: Aug. 15, 1995

[54] CMOS LOGIC GATE CLAMPING CIRCUIT

[75] Inventors: Jack T. Wong, Fremont; Fabiano Fontana, Santa Clara; Martha Chan, Cupertino, all of Calif.

[73] Assignee: Advanced Micro Devices, Inc., Sunnyvale, Calif.

[21] Appl. No.: 137,437

[22] Filed: Oct. 15, 1993

[51] Int. Cl.⁶ ................. H03K 19/01; H03K 19/0175
[52] U.S. Cl. ........................................ 326/17; 326/29; 326/83; 327/546
[58] Field of Search ............... 307/443, 451, 296.4, 307/296.5, 296.8; 326/17, 29, 83, 121; 327/546, 545, 543

[56] References Cited
U.S. PATENT DOCUMENTS

| | | | |
|---|---|---|---|
| 4,346,310 | 8/1982 | Carter | 307/296.4 |
| 4,697,101 | 9/1987 | Iwahashi et al. | 307/443 |
| 4,893,029 | 1/1990 | Matsuo et al. | 307/296.4 |
| 5,151,620 | 9/1992 | Lin | 307/443 |
| 5,168,176 | 12/1992 | Wanlass | 307/443 |
| 5,216,292 | 6/1993 | Imazu et al. | 307/443 |
| 5,218,242 | 6/1993 | Imazu et al. | 307/443 |
| 5,220,205 | 6/1993 | Shigehara et al. | 307/443 |
| 5,304,867 | 4/1994 | Morris | 307/443 |
| 5,306,965 | 4/1994 | Asprey | 307/443 |
| 5,313,118 | 5/1994 | Lundberg | 307/443 |

*Primary Examiner*—Edward P. Westin
*Assistant Examiner*—Richard Roseen
*Attorney, Agent, or Firm*—Raymond Kam-On Kwong; Joseph A. Sawyer, Jr.

[57] ABSTRACT

A gate clamping circuit is disclosed that includes a logic gate and a bias circuit arrangement. Through this clamping circuit the speed of operation of the circuit during both low to high and high-to-low transitions of the output signal are optimized while power consumption is minimized.

11 Claims, 4 Drawing Sheets

CMOS LOGIC GATE CLAMPING CIRCUIT

FIELD OF THE INVENTION

This invention relates generally to CMOS semiconductor integrated circuits and more particularly, it relates to improved CMOS clamp circuits for limiting the voltage rise on a particular node.

BACKGROUND OF THE INVENTION

As is generally well known in CMOS digital integrated circuits normal logic levels are (1) a low or "0" logic state which is represented by a lower power supply potential ($V_{SS}$) and (2) a high or "1" logic state which is represented by upper power supply potential ($V_{CC}$). The lower power supply potential $V_{SS}$ is usually connected to an external ground or 0 volt and the upper potential power supply $V_{CC}$ is typically connected to a voltage source referenced above ground, i.e., +5.0 volts. It is often desirable to limit the voltage swings of CMOS circuits so as to improve the speed of signal transition through the circuits. One method of limiting the voltage swing is controlling the high level voltage ($V_{OH}$) on the output of a logic gate. This method reduces the voltage swing window on the output's high-to-low transition to trip the threshold voltage of the following logic gate but keeps the same voltage swing window on the low-to-high transition. As a result, the operation of the high-to-low transition is faster than if the $V_{OH}$ is not controlled. Although this method is applicable to all the logic gates in an integrated circuit, it is particularly useful in output buffers driving high capacitive loads and interfacing with other integrated circuits because it reduces ground noise on the VSS power supply bus, as explain later. Ground noise is a major problem encountered in designing high speed output buffers since it causes false data sensing and degradation of the output logic levels.

While clamp circuits in CMOS technology are available to perform the function of limiting the $V_{OH}$ voltage, known clamp circuits suffer from the disadvantage of consuming too much power or degrading the speed performance of the output low-to-high transition.

Hence, there is a long felt but unsatisfied need for an improved clamp circuit for lowering the ground noise at the output of a device while not having the power consumption of prior art clamping circuits. In addition, the circuit should also be one which can function at improved operating speeds of known clamp circuits and should be easy to implement in existing circuitry. The present invention addresses such a need.

An example of this type of circuit is shown in FIG. 2. FIG. 2 comprises the a schematic of a prior art clamping circuit 200. As explained earlier, while clamp circuits are available to limit $V_{OH}$ voltage, prior art clamp circuits suffer from the disadvantage of consuming too much power or degrading the speed performance of the output low-to-high transition.

SUMMARY OF THE INVENTION

An improved logic gate clamping circuit is disclosed that comprises a logic gate, the logic gate including an input and an output, and a clamping node. The logic gate is also coupled to a ground potential. The logic circuit also includes a bias means coupled in a feedback relationship between the output of the logic gate and the clamping node for increasing the speed of the transitions at the output and for minimizing power consumption of the logic gate.

In another aspect of the present invention the bias means further includes a first transistor coupled between a $V_{CC}$ power supply and the clamping node; a second transistor coupled to the first transistor and to the $V_{CC}$ power supply, the second transistor also being coupled to the output of the logic gate; third and fourth transistors coupled in series and also coupled to the first and second transistors; and a fifth transistor coupled to the fourth transistor, coupled to the second transistor, coupled to the output of the logic gate and coupled to ground. Through this arrangement significantly less power is consumed.

Finally in yet a third aspect a delay means is coupled between the fifth transistor and the output of the logic gate to further increase the speed of operation of the circuit during low to high transitions.

The present invention therefor provides a clamping circuit coupled to an inverter gate or any other CMOS logic gates such as a NOR gate or a NAND gate to reduce the output high voltage level without sacrificing any speed on the output's low-to-high transition at a power consumption that is much lower than prior art methods.

DETAILED DESCRIPTION

The present invention is an improved clamping circuit for a logic gate. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
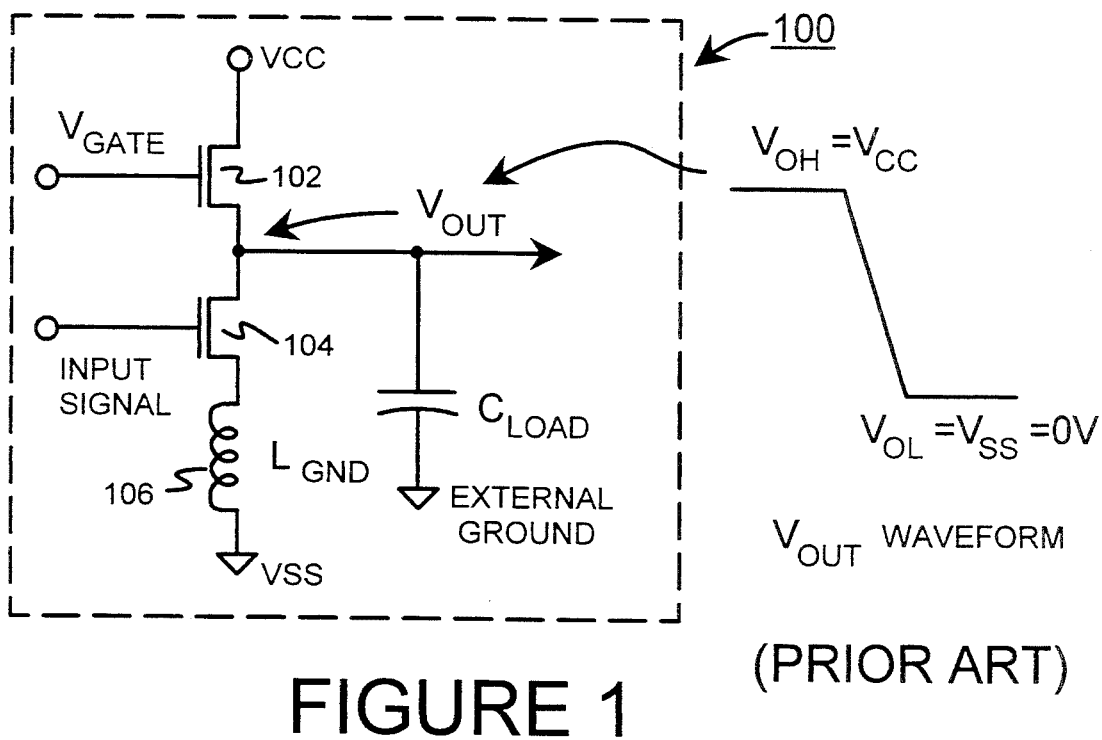
FIG. 1 is a schematic diagram of an output driver circuit.
Figure 2:
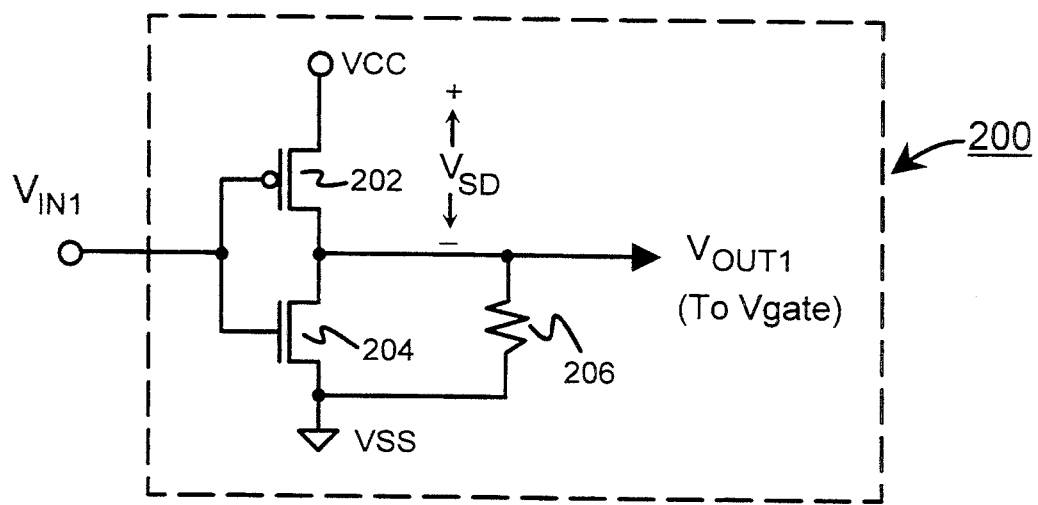
FIG. 2 is a schematic diagram of a prior art gate clamping circuit.

Referring now to FIG. 1, what is shown is a first prior art embodiment of an output driver circuit 100. Circuit 100 includes a first n-channel pull up transistor 102. The drain of transistor 102 is coupled to the $V_{CC}$ power supply and its source is coupled to the output ($V_{OUT}$) and the drain of n-channel transistor 104. The gate of transistor 102 is coupled to a gate drive potential. The gate of transistor 104 is coupled to the input signal and its source is coupled to one end of an inductance $L_{GND}$ 106. The other end of $L_{GND}$ 106 is coupled to the $V_{SS}$ power supply. A load capacitance 108 is coupled between the output and the $V_{SS}$ power supply bus.

Considering the output drive transistor 104 as a time-varying resistor ($R_{OUT}$) for analyzing the ground noise problem (FIG. 1) and assuming the input signal of transistor 104 ramps up with constant gradient going from 0 volt to $V_{CC}$ in Tr nanoseconds (ns). The peak ground noise voltage ($V_{GND}$) on the VSS power bus can be estimated as:

$$V_{GND} = V_{OH}/[1 + (Tr/(L_{GND} * G_O))]$$

where $G_O$ is the maximum conductance of transistor 104 and $L_{GND}$ is the total parasitic inductance of the $V_{SS}$ power supply bus. Consequently, slowing down the ramp rate of the input signal supply to transistor 104 (larger Tr) or decreasing the size of the output driver transistor 104 (smaller $G_O$) would reduce the ground noise, but at the expense of poor propagation delay. Decreasing the package lead inductance would also help (smaller $L_{GND}$), but at a higher cost for the new package technology. Given the known fact that the output swing $V_{OH}$ is proportional to the ground noise voltage $V_{GND}$ and that a smaller voltage swing improves propagation delay, lowering the $V_{OH}$ voltage level using a circuit technique is a very effective method for enhancing performance in high-speed integrated circuits.

Clamping circuit 200 includes a p-channel transistor 202 whose source is coupled to $V_{CC}$. The gate of transistor 202 is coupled to the input signal $V_{IN}1$ and is also coupled to the gate of an n-channel transistor 204. The drain of transistor 204 is coupled to the drain of transistor 202 and is also coupled to the output of the clamping circuit 200. A resistor 206 is coupled between the output of the clamping circuit 200 and the source of transistor 204. The source of transistor 204 is coupled to the $V_{SS}$ power supply bus.

In operation, when the voltage of the signal at the input node $V_{IN}1$ is high, the p-channel transistor 202 is off, the n-channel transistor 204 is on and the output voltage $V_{OUT}1$ at logic low. The logic low voltage level is 0 volt because no current flows across transistor 204 so that the voltage $V_{OUT}1$ across the drain and source of transistor 204 is 0 volt. The biased resistor 206 has no effect on the DC low voltage level, in this case.

When the input mode $V_{IN}1$ is low, the p-channel transistor 202 is on, the n-channel transistor 204 is off and the output voltage $V_{OUT}1$ is at logic high. In this case, transistor 202 is conducting and current flows across transistor 202 to resistor 206. A source to drain voltage potential $V_{SD}$ is created across the source and the drain of transistor 202 so that the high voltage level of $V_{OUT}1$ is $V_{CC} - V_{SD}$. As can be seen, a large value for resistor 206 will set the high voltage level of $V_{OUT}1$ towards $V_{CC}$ and a small value towards ground. By choosing the appropriate value for resistor 206, a desirable high voltage level below $V_{CC}$ for $V_{OUT}1$ is obtainable.

It is known that transistors 202 and 204 in the prior art form the circuit of a CMOS inverter whose output $V_{OUT}1$ is used for driving the gate of the following stage. Hence, fast switching speed for this circuit is very critical. As described above, the resistor 206 is used to bias the high voltage level of $V_{OUT}1$ at $V_{CC} - V_{SD}$ so as to improve the delay of the high-to-low transition on the output $V_{OUT}1$. Accordingly, the circuit configuration comprising transistors 202 and 204 and resistor 206 functions as an inverter as well as a high level clamp for the following stage.

Although this scheme operates satisfactory in clamping the high voltage level, it suffers two major problems. First, a significant amount of current is required to bias the high voltage level of $V_{OUT}1$, especially if this level is significantly lower than $V_{CC}$. This current must be relatively high in this condition due to the current going across resistor 206 and the inherent behavior of transistor 202. Typically, a low value for resistor 206 and a large transistor 202 are utilized for good speeds. With this type of arrangement, too much power is consumed. Second, the speed of the low-to-high transition on the output is degraded because the resistor 206 is loading the output so that transistor 202's driving capability is decreased.

Figure 3:
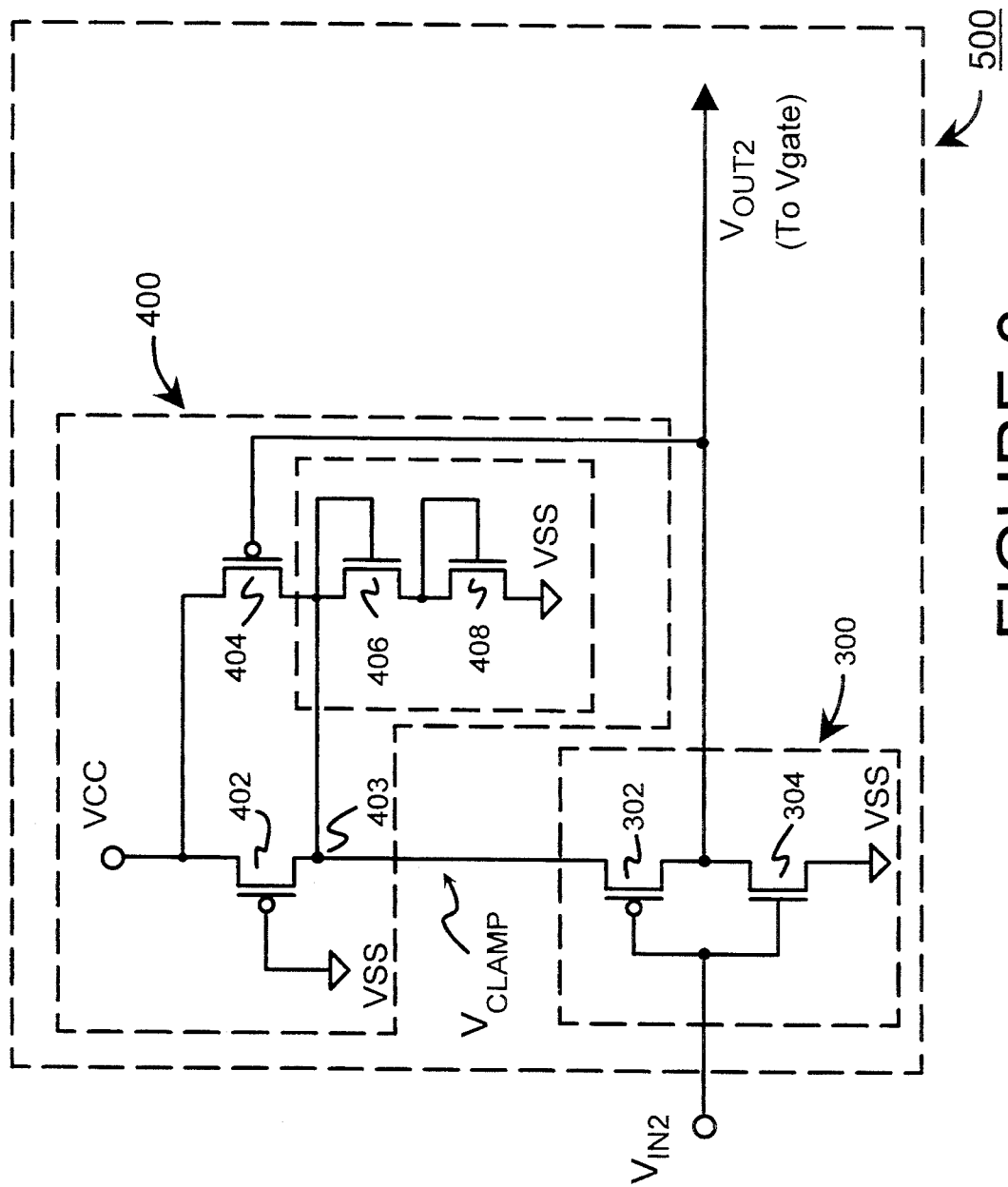
FIG. 3 is a schematic diagram of a first embodiment of a gate clamping circuit in accordance with the present invention.

FIG. 3 is a first embodiment of a logic gate clamping circuit 500 in accordance with the present invention. The circuit 500 receives an input signal $V_{IN}2$ at the gates of p-channel transistor 302 and n-channel transistor 304. The source of transistor 304 is coupled to the $V_{SS}$ power supply bus. The drain of transistor 304 is coupled to the drain of the transistor 302. The source of transistor 302 is coupled to the $V_{CLAMP}$ node 403, to the drain of transistor 402, to the drain of transistor 404 and to the drain and gate of transistor 406. The gate of transistor 402 is coupled to the $V_{SS}$ power supply. The source of transistor 402 is coupled to Vcc and to the source of p-channel transistor 404. The gate of transistor 404 is coupled in feedback relationship to $V_{OUT}2$. The source of transistor 406 is coupled to the drain and gate of transistor 408. The source of transistor 408 is coupled to $V_{SS}$.

The clamping circuit 500 comprises a bias circuit 400 comprising p-channel transistors 402, and 404 and n-channel transistors 406 and 408 which operates in conjunction with an inverter gate comprising of p-channel transistor 302 and n-channel transistor 304 to form a complete gate clamping circuit 500. The node of the bias circuit which interfaces with the inverter gate is $V_{CLAMP}$ 403. The source of transistor 302 normally connecting to $V_{CC}$ in a standard inverter design is connected instead to $V_{CLAMP}$ node 403 for this design. The inverter gate 300 can be replaced with a NOR gate, a NAND gate, or any other types of logic gates without affecting the operation of the bias circuit.

In operation, when the voltage of $V_{IN}2$ is low, the p-channel transistor 302 is on, the n-channel transistor 304 is off and the output voltage $V_{OUT}2$ is at logic high. If the designed logic high voltage level on the output is above $V_{CC} - V_{TP}$, where $V_{TP}$ is the threshold of transistor 404, then transistor 404 is off. When transistor 404 is off, the $V_{CLAMP}$ node 403 is determined by the DC biased network comprising of transistors 402, 406 and 408. Also, since no current flows across transistor 302 as it is driving only the gate capacitance of the following stage, there is no voltage potential across the drain and source of transistor 302 and the logic high voltage level $V_{OUT}$ is the same as $V_{CLAMP}$. When the output is at logic high, the $V_{CLAMP}$ voltage is designed to be at or above $V_{CC} - V_{TP}$ since this voltage level ensures transistor 404 turns off so as to prevent it from having any effect on the biased voltage $V_{CLAMP}$. Accordingly, the lowest clamped voltage level on the output is $V_{CC} - V_{TP}$ for the proper operation.

As the threshold of the p-channel transistors in CMOS process technology can be selectively designed to be as large as 2.5 volts, the clamp output voltage level can be as low as 2.5 volts at $V_{CC}$ of 5.0 volts and is sufficiently low enough for most applications. Minimal power is required to bias this circuit because the pull-up transistor 402 does not require any driving capability when the input $V_{IN}2$ switches from logic low to logic high and correspondingly the output from logic high to logic low on the next transition. Thus, transistors 402, 406 and 408 are made very small regardless the sizes of transistors 302 and 304. This arrangement for clamping the source of transistor 302 is a very effective method of lowering the logic high voltage level on the output to speed up the AC operation of the high-to-low transition.

When the voltage of $V_{IN}2$ is high, the p-channel transistor 302 is off, the n-channel transistor 304 is on and the output voltage $V_{OUT}2$ is at logic low. The logic low voltage level is VSS so that transistor 404 is on. The size of transistor 404 is designed much larger than that of transistor 402 so that the stronger transistor 404 biases the voltage on $V_{CLAMP}$ node 403 to be approximately $V_{CC}$. On the next transition when $V_{IN}2$ switches from logic high to logic low, the corresponding low-to-high switching on the output is performed quickly because of the strong pull-up action of transistor 404 couples the $V_{CLAMP}$ node 403 to $V_{CC}$ at very low impedance. Using large enough size for transistor 404, the node behavior on $V_{CLAMP}$ node 403 will remain at $V_{CC}$ for a finite delay until it discharges down to the minimal value of $V_{CC} - V_{TP}$ after the output voltage goes to the logic high level. Hence, the source of transistor 302 is virtually connected to $V_{CC}$ so that the delay on the output's low-to-high transition is approximately the same as that of a standard inverter gate. In comparison to a standard inverter gate, very minimal delay effect on the output° s low-to-high transition will result using this clamping method.

The above description explains how the new gate clamping circuit functions better with lower DC power and faster speed on the low-to-high output transition. It should be noted that transistors 406 and 408 can be replaced with any other types of biased circuits such as current sources without changing the functionality of the clamping circuit. Also noted is that the bias circuit 400 operates as a feedback circuit which accepts the output signal $V_{OUT}2$ and feeds a signal $V_{CLAMP}$ back to the inverter gate 300.

Figure 4:
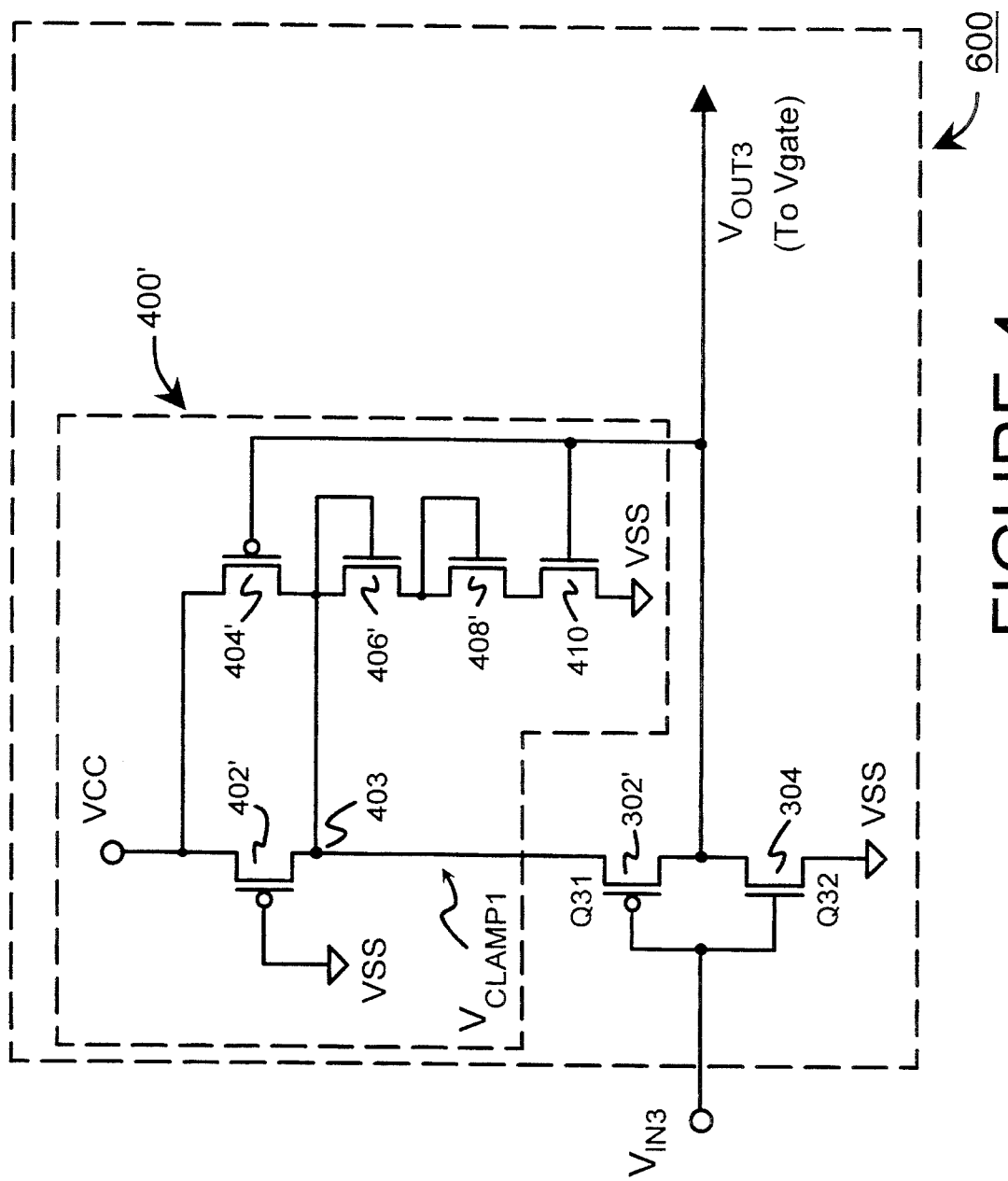
FIG. 4 is a schematic diagram of a second embodiment of a gate clamping circuit in accordance with the present invention.

Also shown in FIG. 4 is another embodiment of the gate clamping circuit with an additional n-channel transistor 410 having its gate coupled to $V_{OUT}3$, drain to transistor 408', and source to $V_{SS}$. This circuit configuration 600 has an advantage of further reducing power when the output is at logic low. When the output is in the logic low state, transistor 410 is off. Hence, the gate clamping circuit consumes no DC power while the pull-up action of transistor 404' is holding the node $V_{CLAMP}$ node 403 at $V_{CC}$, the same voltage in the clamping circuit of FIG. 3. When the output is in the logic high state, however, transistor 410 is on and this gate clamping circuit 400' consumes the same DC power as that in the previous circuit configuration without affecting the node voltage on $V_{CLAMP}$ node 403. As a result, this circuit 400' consumes half the power in a most often used 50% duty cycle.

Figure 5:
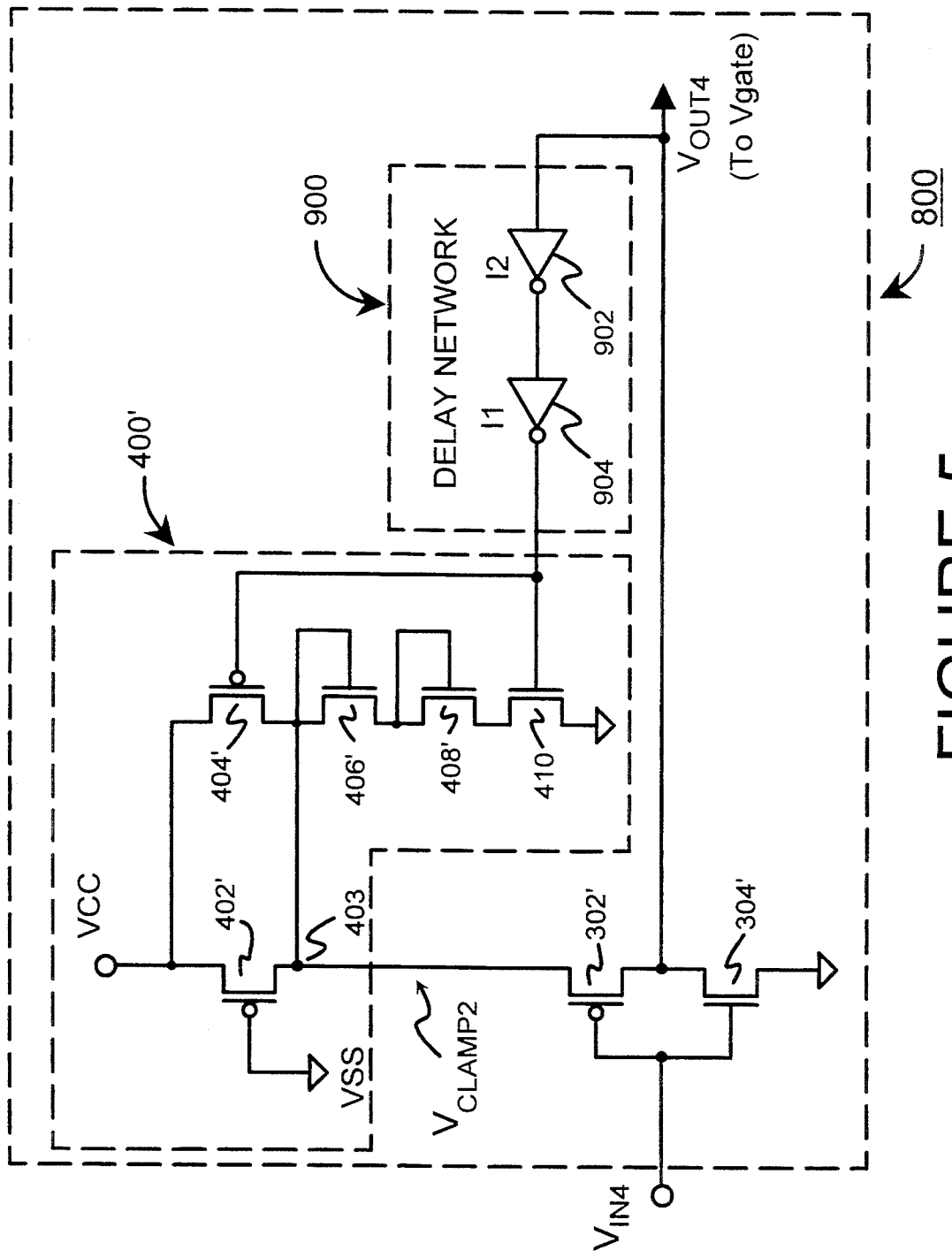
FIG. 5 is a schematic diagram of a third embodiment of a gate clamping circuit in accordance with the present invention.

Finally, FIG. 5 shows a third embodiment of the gate clamping circuit with an addition of a delay circuit network 900 coupled between the gate clamping circuit 400' and the output $V_{OUT}4$. This circuit configuration 800 has an advantage of further improving the speed of the output's low-to-high transition. It is desirable to retain the voltage on $V_{CLAMP}$ 403 at approximately $V_{CC}$ as long as possible before it drops backs to the lower clamped voltage during the output's low-to-high transition because this enables the source of transistor 302' to couple to $V_{CC}$ at very low impedance, thus improving the pull-up action of transistor 302.

The clamping circuit 800 also eliminates the restriction in which the lowest logic high clamped voltage on $V_{OUT}4$ is $V_{CC} - V_{TP}$ because even if $V_{OUT}4$ is below this voltage, the threshold of inverter 902 in the delay network can be adjusted to trip this logic gate such that its output is logic low and the output of inverter 904 at logic high ($V_{CC}$), thus turning off transistor 404' for the proper operation as described above. In addition, this method eliminates the need of a specially adjusted threshold device for transistor 404' to turn it off as mentioned above because the gate voltage is at $V_{CC}$, significantly higher than $V_{CC} - V_{TP}$. Overall, the delay circuit network 900 improves the delay on the output low-to-high transition, enables the logic high clamped voltage on $V_{OUT}4$ to operate below $V_{CC} - V_{TP}$, and eliminates special process requirements for adjusting the threshold for transistor 404'. Although two inverter gates in series performs the delay task; it is readily recognized by one of ordinary skill in the art that a variety of delay networks could be utilized and their use would be within the spirit and scope of the present invention.

Although the present invention has been described in accordance with the embodiments shown in the figures one of ordinary skill in the art will recognize there could be variations to those embodiments and those variations would be within the spirit and scope of the present invention. Accordingly, many modifications may be made by one of ordinary skill in the art without departing from the spirit and scope of the appended claims.

What is claimed is:

1. A logic gate clamping circuit comprising:
   a logic gate, the logic gate including an input for receiving an input signal, an output, and a clamping node, the logic gate being coupled to a ground potential; and
   bias means coupled in a feedback relationship between the output of the logic gate and the clamping node for increasing the speed of the transitions of the input signal at the output and for minimizing power consumption of the logic gate the bias means includes a first transistor coupled between a $V_{CC}$ power supply and the clamping node; a second transistor coupled to the first transistor and to the $V_{CC}$ power supply, the second transistor also being coupled to the output of the logic gate; and third and fourth transistors coupled in series and also coupled between the second transistor and ground.

2. The clamping circuit of claim 1 in which the logic gate comprises an inverter.

3. The clamping circuit of claim 1 in which the first and second transistors comprise p channel transistors.

4. The clamping circuit of claim 1 in which the third and fourth transistors comprise n channel transistors.

5. A logic gate clamping circuit for comprising:
   a logic gate, the logic gate including an input for receiving an input signal, an output, and a clamping node, the logic gate being coupled to a ground potential; and
   bias means coupled in a feedback relationship between the output of the logic gate and the clamping node for increasing the speed of the transitions of the input signal at the output and for minimizing power consumption of the logic gate, the bias means further comprising;

a first transistor coupled between a $V_{CC}$ power supply and the clamping node;

a second transistor coupled to the first transistor and to the $V_{CC}$ power supply, the second transistor also being coupled to the output of the logic gate;

third and fourth transistors coupled in series and also coupled to the first and second transistors; and a fifth transistor coupled to the fourth transistor, coupled to the second transistor, coupled to the output of the logic gate and coupled to ground.

6. The clamping circuit of claim 5 in which the first and second transistors comprise p-channel transistors.

7. The clamping circuit of claim 5 in which the third, fourth and fifth transistors comprise n-channel transistors.

8. A logic gate clamping circuit comprising:

a logic gate, the logic gate including an input for receiving an input signal, an output, and a clamping node, the logic gate being coupled to a ground potential;

bias means coupled to the clamping node for increasing the speed of the transitions of the input signal at the output and for minimizing power consumption of the logic gate the bias means further comprises a first transistor coupled between a $V_{CC}$ power supply and the clamping node; a second transistor coupled to the first transistor and to the $V_{CC}$ power supply; third and fourth transistors coupled in series and also coupled to the first and second transistors; and a fifth transistor coupled to the fourth transistor, coupled to the second transistor; and a delay means coupled in feedback relationship between the bias means and the output of the logic gate for improving the speed during a low to high transition on the output of the logic gate, the delay means being coupled to the second transistor and the fifth transistor.

9. The clamping circuit of claim 8 in which the first and second transistors comprise p channel transistors.

10. The clamping circuit of claim 8 in which the third, fourth and fifth transistors comprise n channel transistors.

11. The clamping circuit of claim 8 in which the delay means comprises first and second inverters coupled in series.

* * * * *